(12) United States Patent
Shimoida et al.

(10) Patent No.: US 7,768,035 B2
(45) Date of Patent: Aug. 3, 2010

(54) SEMICONDUCTOR DEVICE AND METHOD OF MANUFACTURING THE SAME

(75) Inventors: Yoshio Shimoida, Yokosuka (JP); Tetsuya Hayashi, Yokosuka (JP); Masakatsu Hoshi, Yokohama (JP); Hideaki Tanaka, Yokohama (JP); Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 333 days.

(21) Appl. No.: 12/066,145

(22) PCT Filed: Aug. 2, 2006

(86) PCT No.: PCT/JP2006/315690

§ 371 (c)(1),
(2), (4) Date: Mar. 7, 2008

(87) PCT Pub. No.: WO2007/029444

PCT Pub. Date: Mar. 15, 2007

(65) Prior Publication Data

US 2009/0267113 A1    Oct. 29, 2009

(30) Foreign Application Priority Data

Sep. 8, 2005    (JP) .............................. 2005-260696

(51) Int. Cl.
*H01L 31/0328* (2006.01)

(52) U.S. Cl. ................. 257/192; 257/328; 257/E29.04; 257/E29.042; 257/E29.271; 257/E21.409; 438/268

(58) Field of Classification Search ................. 257/192, 257/328, E29.04, E29.042, E29.271, E21.409; 438/268
See application file for complete search history.

(56) References Cited

U.S. PATENT DOCUMENTS

| 5,408,118 | A | 4/1995 | Yamamoto |
| 6,025,233 | A | 2/2000 | Terasawa |
| 7,005,704 | B2 * | 2/2006 | Hayashi et al. ............. 257/342 |
| 2004/0217358 | A1 | 11/2004 | Kaneko |
| 2004/0251503 | A1 | 12/2004 | Hayashi et al. |

FOREIGN PATENT DOCUMENTS

| EP | 1 641 030 A2 | 3/2006 |
| JP | 2003-318398 | 11/2003 |

* cited by examiner

*Primary Examiner*—Tu-Tu V Ho
(74) *Attorney, Agent, or Firm*—Foley & Lardner LLP

(57) ABSTRACT

A semiconductor device has a semiconductor base of a first conductivity type; a hetero semiconductor region in contact with the semiconductor base; a gate electrode adjacent to a portion of a junction between the hetero semiconductor region and the semiconductor base across a gate insulating film; a source electrode connected to the hetero semiconductor region; and a drain electrode connected to the semiconductor base. The hetero semiconductor region has a band gap different from that of the semiconductor base. The hetero semiconductor region includes a first hetero semiconductor region and a second hetero semiconductor region. The first hetero semiconductor region is formed before the gate insulating film is formed. The second hetero semiconductor region is formed after the gate insulating film is formed.

20 Claims, 10 Drawing Sheets

SEMICONDUCTOR DEVICE AND METHOD OF MANUFACTURING THE SAME

TECHNICAL FIELD

The present invention relates to a semiconductor device and a method of manufacturing the same.

BACKGROUND ART

As a known technology, there is a field-effect transistor utilizing a heterointerface. In a known example, the thickness of a barrier at the heterointerface is controlled by a voltage applied to a gate electrode, and carriers are enabled to pass through by tunneling current when the element is on. Such a field-effect transistor utilizing the heterointerface does not have a channel region such as in a MOSFET, but has a device structure less susceptible to high channel resistance. Thus, a power semiconductor switch having high breakdown voltage and low on-resistance is provided.

DISCLOSURE OF INVENTION

In known technologies, because of a structure, in which silicon carbide (SiC) forming an ohmic contact to a drain electrode and polysilicon (poly-Si) connected to a source electrode form a heterojunction, and in which a gate electrode is adjacent to a portion of the heterojunction across a gate insulating film, current when the element is on flows along the interface between the gate insulating film and the polysilicon and the interface between the gate insulating film and the silicon carbide (SiC). Because of a structure in which a channel region extending for several micrometers does not exist, the influence of interface mobility is smaller than in a MOSFET. Nevertheless, higher interface mobility is more advantageous. Accordingly, it is conceivable to reduce interface states by performing high-temperature heat treatment in an $N_2O$ atmosphere or the like. Moreover, there are cases where high-temperature heat treatment is performed on a poly-Si layer in order to further reduce on-resistance by controlling the grain size of poly-Si, which becomes a current path. However, there is apprehension that such high-temperature heat treatment may adversely influence a heterointerface which determines OFF characteristics of the element. Specifically, there is apprehension that reverse breakdown voltage may be lowered.

The present invention has been accomplished in view of the above-described problems. An object of the present invention is to provide a semiconductor device having low on-resistance and greatly improved reverse characteristics, and to provide a method of manufacturing the same.

Provided is a semiconductor device including: a hetero semiconductor region having a band gap different from that of a semiconductor base of a first conductivity type; a gate electrode formed to be adjacent to a portion of a junction between the hetero semiconductor region and the semiconductor base across a gate insulating film; a source electrode connected to the hetero semiconductor region; and a drain electrode in ohmic contact with the semiconductor base. The hetero semiconductor region includes a first and a second hetero semiconductor regions. The first hetero semiconductor region is formed before the gate insulating film is formed, and the second hetero semiconductor region is formed after the gate insulating film is formed.

BEST MODE FOR CARRYING OUT THE INVENTION

Hereinafter, best modes for carrying out the invention will be described using embodiments.

First Embodiment

Figure 1:
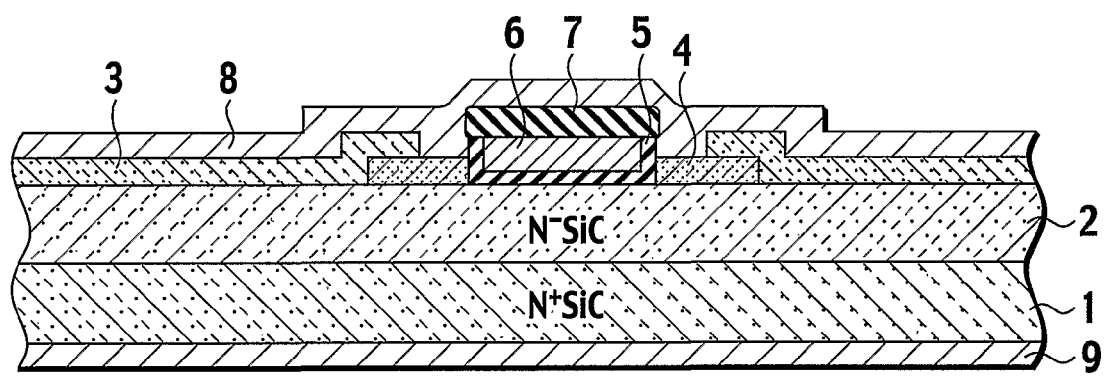
FIG. 1 shows a cross-sectional device structure of a field-effect transistor, which is a semiconductor device according to the first embodiment of the present invention.

A first embodiment of the present invention will be described using FIG. 1. FIG. 1 shows a cross-sectional device structure of a field-effect transistor, which is a semiconductor device according to the present invention. This drawing corresponds to a cross section in which two unit cells are placed opposite each other. In practice, a plurality of such cells are connected in parallel to form an element, but this cross-sectional structure will be described as a representative one.

First, the structure will be described. On one main surface of a heavily doped N type (N+ type) SiC substrate region 1, a lightly doped N type (N− type) SiC drain region 2 is formed. The SiC substrate region 1 and the SiC drain region 2 constitute a semiconductor base of a first conductivity type. The SiC drain region 2 is made of an epitaxial layer grown on the SiC substrate region 1. SiC has several polytypes (crystalline polymorphs). Here, a description will be given on the assumption that the SiC is 4H—SiC, which is representative thereof. The SiC may be another one of them, i.e., 6H—SiC or 3C—SiC. In this embodiment and subsequent embodiments, N type is the first conductivity type, and P type is a second conductivity type.

In FIG. 1, the concept of the thicknesses of the SiC substrate region 1 and the SiC drain region 2 is omitted. In practice, the SiC substrate region 1 has a thickness of several hundreds of micrometers, and the SiC drain region 2 has a thickness of approximately several micrometers to ten-odd micrometers.

On one main surface side (the opposite side to the SiC substrate region 1) of the N− type SiC drain region 2, P+type hetero semiconductor regions 3, which are second hetero semiconductor regions having polysilicon (poly-Si) as a constituent material, are formed in contact with the SiC drain region 2. The band gaps of SiC and polysilicon differ from each other, and the electron affinities thereof also differ from each other. Accordingly, a heterojunction is formed at the interface therebetween (this is the reason why polysilicon is used for hetero semiconductor regions).

Furthermore, on portions of the main surface side (the opposite side to the SiC substrate region 1) of the N− type SiC drain region 2, N+ type hetero semiconductor regions 4, which are first hetero semiconductor regions, are formed in contact with the SiC drain region 2. The P+type hetero semiconductor regions 3 are formed on these N+ type hetero semiconductor regions 4 in an overlap manner. That is, the N+ type hetero semiconductor regions 4 and the P+type hetero semiconductor regions 3 have portions which overlap each other in the direction from a source electrode 8 to a drain electrode 9.

A gate electrode 6 is formed which is adjacent to portions of the junctions between the N− type SiC drain region 2 and the N+ type hetero semiconductor regions 4 across a gate insulating film 5. On the upper side of the gate electrode 6, a cap oxide film 7 is formed. The P+type hetero semiconductor regions 3 and the N+ type hetero semiconductor regions 4 are connected directly to the source electrode 8. Features are the following: contact portions in which the N+ type hetero semiconductor regions 4 are in contact with the source electrode 8 are close to the gate insulating film 5; and, in the case where the N+ type hetero semiconductor regions 4 are used as current paths when the element is on, there are no useless regions such as extraction regions in a lateral direction, and a structure advantageous in miniaturization is provided.

The drain electrode 9 forms an ohmic contact with a low-electrical-resistance to the back surface of the SiC substrate region 1. Thus, the semiconductor base forms an ohmic contact to the drain electrode 9. The gate electrode 6 is insulated and isolated from the source electrode 8 by the cap oxide film 7.

A process for manufacturing the field-effect transistor according to this embodiment will be described using FIGS. 2A to 2I.

Figure 2A:
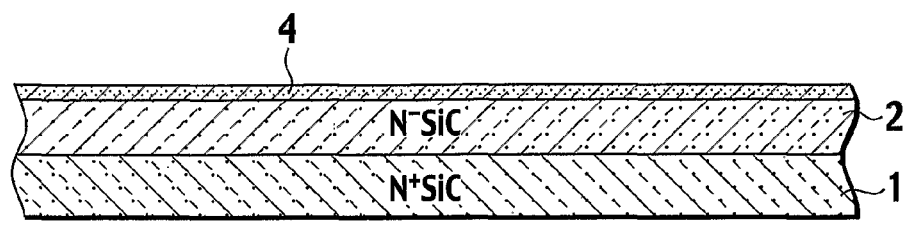
FIG. 2A to 2I are cross sectional diagrams showing a method of manufacturing a field-effect transistor according to the first embodiment of the present invention shown in FIG. 1.

In FIG. 2A, the N− type SiC drain region 2 is formed which is epitaxially grown on one main surface of the N+ type SiC substrate region 1. Furthermore, after the surface of the SiC drain region 2 is cleaned by pretreatment or the like, a poly-Si layer (polysilicon layer) which becomes the N+ type hetero semiconductor regions 4 is deposited (denoted by the same reference numeral 4). A typical thickness of this layer is in the range of several hundreds of angstroms to several micrometers. After the deposition of the poly-Si layer 4, high-temperature heat treatment may be performed at a temperature of not more than 1300° C. in order to control the sizes of grain boundaries of poly-Si and to reduce the resistances of the current paths when the element is on. Thereafter, an impurity of N+ type is introduced into the poly-Si layer 4. As a method of introducing the N+ type impurity, ion implantation may be used, or a method such as deposition/diffusion (diffusion from an impurity-containing deposited layer) or vapor-phase diffusion may be used.

Figure 2B:
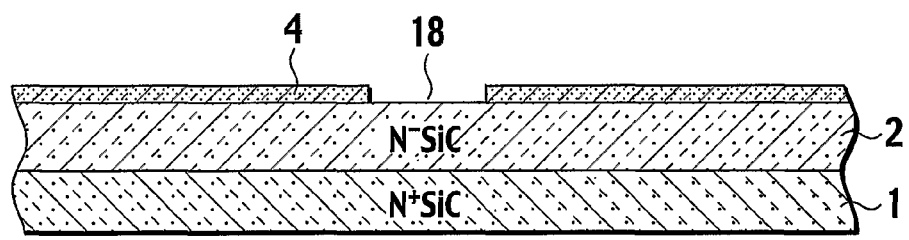

In FIG. 2B, in order to provide a region 18 for forming the gate electrode 6 at a desired position on the main surface side, a portion of the poly-Si layer 4 at the position is etched, whereby the surface of the lightly doped N type (N− type) SiC drain region 2 is exposed. Here, the surface of the lightly doped N type (N− type) SiC drain region 2 is not etched, but may be etched to be grooved.

Figure 2C:
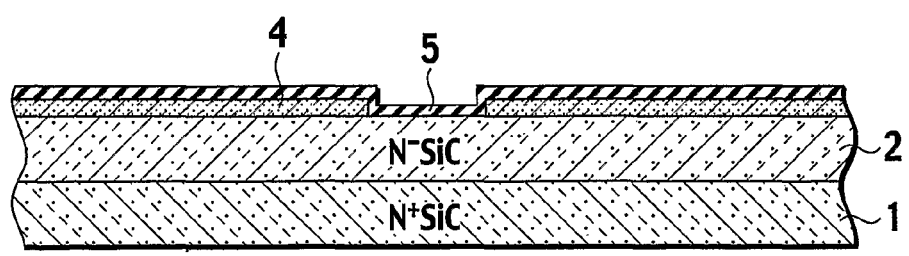

In FIG. 2C, an insulating material layer which is to be the gate insulating film 5 is deposited (denoted by the same reference numeral 5) on the main surface side. A typical thickness of this layer is in the range of several hundreds of angstroms to several thousands of angstroms. Then, high-temperature heat treatment is performed in, for example, an NO or N₂O atmosphere at a temperature of, for example, 900° C. to 1300° C. for approximately several tens of minutes in order to reduce interface states at the interface between the gate insulating film 5 and the lightly doped N type (N− type) SiC drain region 2 or the interfaces between the gate insulating film 5 and the N+ type hetero semiconductor regions 4.

Figure 2D:
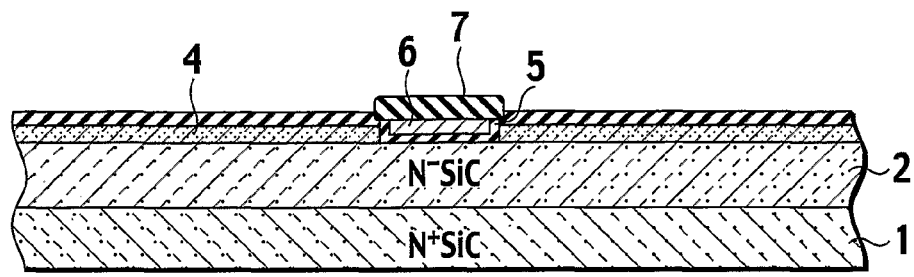

In FIG. 2D, poly-Si for forming the gate electrode 6 is first thickly deposited on the gate insulating film 5, and etched back to a state in which the poly-Si fills up the etched portion, whereby the gate electrode 6 is formed. Moreover, the cap oxide film 7 is locally thickly formed by performing oxidation on the gate electrode 6.

Figure 2E:
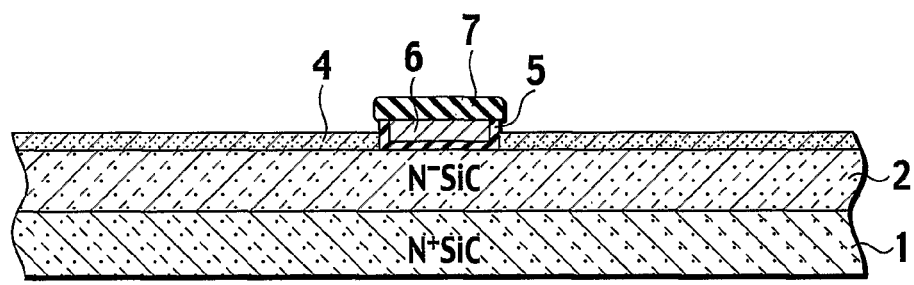

In FIG. 2E, the surrounding unnecessary insulating material layer is removed by etching so that the cap oxide film 7 is left, whereby the gate insulating film 5 is left.

Figure 2F:
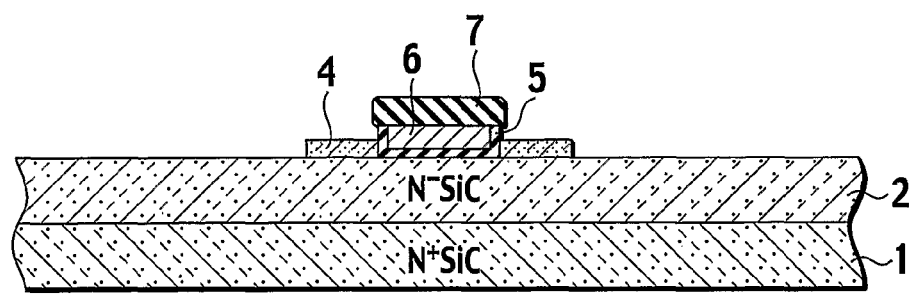

In FIG. 2F, though not shown, a portion in the vicinity of the gate electrode 6 is covered with a mask made of photoresist, and an uncovered portion of the poly-Si layer is removed by etching, whereby the N+ type hetero semiconductor regions 4 are left. This drawing shows a state in which the resist is removed. In this way, a structure is obtained in which the N+ type hetero semiconductor regions 4 are left in the periphery of the gate electrode 6.

Figure 2G:
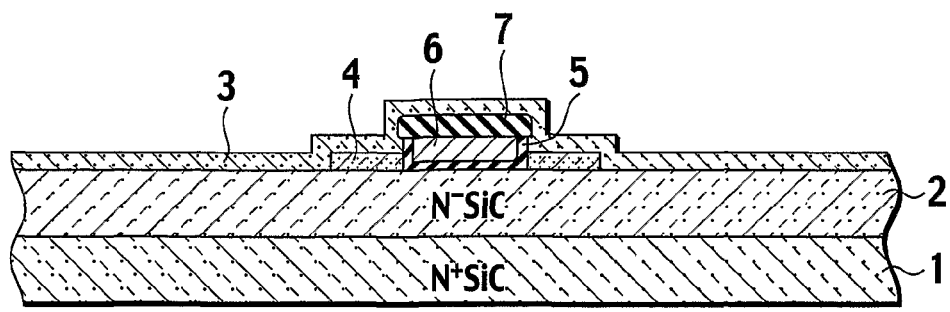

In FIG. 2G a poly-Si layer which is to be the P+type hetero semiconductor regions 3 is deposited (denoted by the same reference numeral 3) so as to cover the top of the structure in the state of FIG. 2F, and an impurity is introduced so that the poly-Si layer becomes P+type. As a method of introducing the impurity, possible methods are ion implantation, deposition/diffusion, vapor-phase diffusion, or the like, as in the case of N+ type.

Figure 2H:
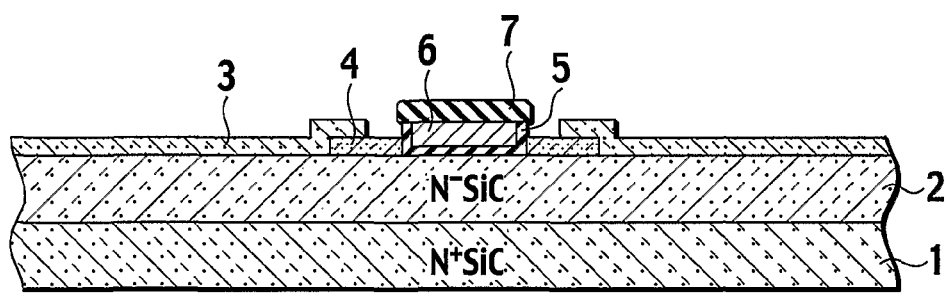

In FIG. 2H, the poly-Si layer 3 on the cap oxide film 7 and portions of the N+ type hetero semiconductor regions 4 is removed by etching so as to leave regions in which the P+type hetero semiconductor regions 3 overlap the N+ type hetero semiconductor regions 4.

Figure 2I:
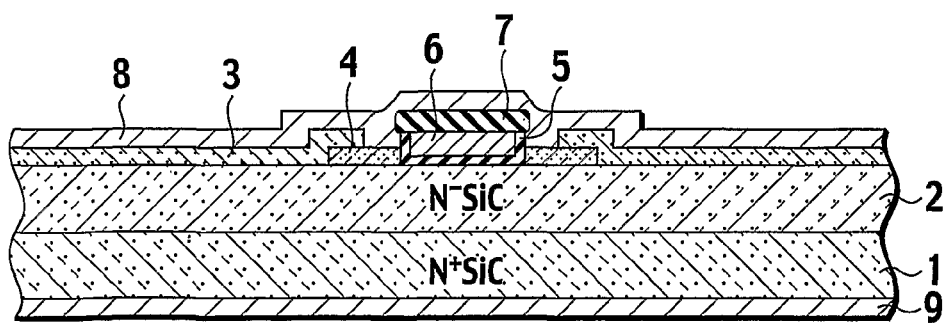

In FIG. 2I, the source electrode 8 having metal or the like as a constituent material is formed over the entire region on a first main surface side to make low-resistance electrical connections to the P+type hetero semiconductor regions 3 and the N+ type hetero semiconductor regions 4, respectively. Furthermore, the drain electrode 9 having metal or the like as a constituent material is formed on the entire back surface side of the SiC substrate region 1 to form a low-resistance ohmic contact thereto. Thus, the drain electrode 9 is connected to the semiconductor base.

By the above-described process, a device of this embodiment is completed.

In the aforementioned manufacturing process, the P+type hetero semiconductor regions 3, which are the second hetero semiconductor regions, are formed after the step (described in the explanation relating to FIG. 2C) of performing heat treatment on the gate insulating film 5 (described in the explanation relating to FIG. 2G). In this way, the second hetero semiconductor regions, which dominantly determine OFF characteristics of the element, can be formed after heat treatment is performed on the gate insulating film 5. Accordingly, an effect is produced, which is that OFF characteristics (reverse characteristics) of the element can be greatly improved while low on-resistance is realized.

In addition, the N+ type hetero semiconductor regions 4, which are the first hetero semiconductor regions, may be subjected to heat treatment before the formation of the P+type hetero semiconductor regions 3, which are the second hetero semiconductor regions (described in the explanation relating to FIG. 2A). In this way, the second hetero semiconductor regions can be formed after heat treatment is performed on the first hetero semiconductor regions. Accordingly, an effect is produced, which is that OFF characteristics of the element can be greatly improved while low on-resistance is realized.

Moreover, when patterning (pattern-making process) is performed on the N+ type hetero semiconductor regions 4, which are the first hetero semiconductor regions, a region for forming the gate electrode 6 and regions for contact between the SiC drain region 2 of the semiconductor base and the P+type hetero semiconductor regions 3, which are the second hetero semiconductor regions, may be formed by the same etching. That is, when the hetero semiconductor regions 4 are patterned to form the N+ type hetero semiconductor regions 4, the state of the poly-Si layer 4 may be changed from the state of FIG. 6A to the state (ignore the insulating material layer 5, the gate electrode 6, and the cap oxide film 7) of FIG. 2F by the same etching. By doing so, since the narrow N+ type hetero semiconductor regions 4 can be formed in a self-aligned manner, it is advantageous in element miniaturization, and an effect is produced, which is that an element having lower on-resistance can be realized.

Next, the operation of the field-effect transistor manufactured by this embodiment will be described with effects thereof.

Basic on/off operations are the same as those of a known example. In the case where a voltage applied to the gate electrode 6 is not more than a certain threshold voltage with respect to the source electrode 8, the element is in an off state. In the case where a voltage of not more than the breakdown voltage of the element is applied to the drain electrode 9, relatively large barriers exist at the heterointerfaces between the N− type SiC drain region 2 and the P+type hetero semiconductor regions 3. A depletion layer extends into the N− type SiC drain region 2 by a voltage applied between the drain electrode 9 and the source electrode 8, and OFF characteristics are maintained between the drain electrode 9 and the source electrode 8. The height of this barrier is determined by the band structure of the heterojunction, and depends on the Fermi level of polysilicon, in other words, depends on the impurity concentration of the hetero semiconductor region 3.

When a voltage applied to the gate electrode 7 becomes the certain threshold voltage or more with respect to the source electrode 8, the element changes into an on state. The electric field from the gate electrode 7 reduces the thicknesses of barriers in portions which are in contact with the gate insulating film 5 at the interfaces between the N− type SiC drain region 2 and the N+ type hetero semiconductor regions 4. Then, when carriers are enabled to pass through by tunneling current, current comes to flow between the drain electrode 9 and the source electrode 8. Moreover, since interface states are reduced by high-temperature heat treatment performed on the gate oxide film 5 as described in the manufacturing process, mobility is improved. Thus, an element having low on-resistance can be obtained.

As described previously, in this embodiment, the hetero semiconductor regions 3 of the second conductivity type (P type in this case) which dominantly determine OFF characteristics of the element can be formed after high-temperature heat treatment (see the explanation relating to FIG. 2C) is performed on the gate insulating film 5 (see the explanation relating to FIG. 2G). Accordingly, there is the effect that OFF characteristics (reverse characteristics) of the element can be greatly improved while low on-resistance is realized.

Moreover, there is the effect that OFF characteristics of the element can be greatly improved while low on-resistance is realized, because the hetero semiconductor regions of the second conductivity type are formed after high-temperature heat treatment is performed on the hetero semiconductor regions of the first conductivity type in a similar manner as described above.

Furthermore, the hetero semiconductor regions 4 of the first conductivity type (N type in this embodiment) which becomes current paths in terms of structure does not have useless regions in a lateral direction, and it is advantageous in element miniaturization. Thus, there is the effect that an element having lower on-resistance can be realized.

Second Embodiment

Figure 3:
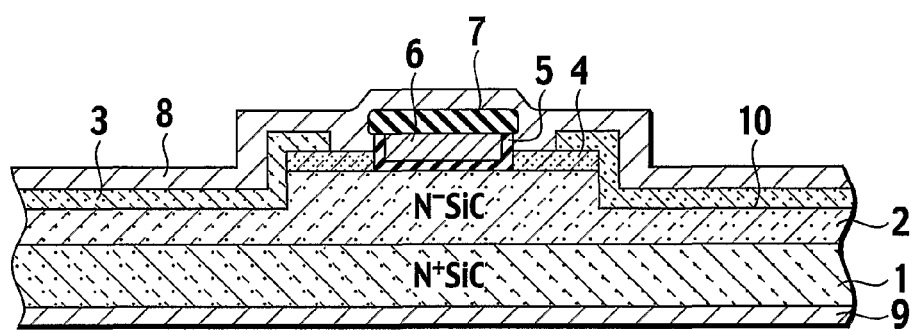
FIG. 3 shows a cross-sectional device structure of a field-effect transistor, which is a second embodiment of the present invention.

FIG. 3 shows a cross-sectional device structure of a field-effect transistor, which is a second embodiment of the present invention. This cross-sectional structure corresponds to a cross-sectional structure in which two unit cells are placed opposite each other in a similar manner as in the structure shown in FIG. 1. The basic structure is similar to that described using FIG. 1. Accordingly, only different portions will be described.

On one main surface side of the N− type SiC drain region 2, groove portions 10 are formed as etched SiC surfaces. The P+type hetero semiconductor regions 3, which are the hetero semiconductor regions of the second conductivity type having poly-Si as a constituent material, are formed in contact with the bottom surfaces and side surfaces of the groove portions 10. That is, the groove portions 10 reaching positions closer to the drain electrode 9 than the positions where the N+ type hetero semiconductor regions 4, which are the first hetero semiconductor regions, are in contact with the SiC drain region 2 of the semiconductor base, are formed in the SiC drain region 2 of the semiconductor base; and, in the groove portions 10, the P+type hetero semiconductor regions 3, which are the second hetero semiconductor regions, are in contact with the SiC drain region 2 of the semiconductor base.

Figure 4:
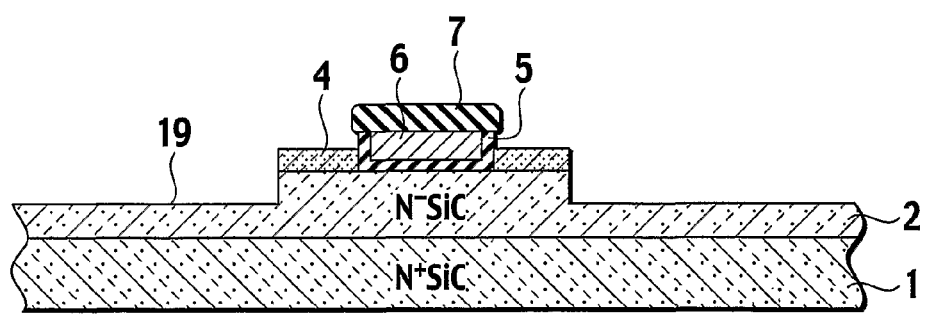
FIG. 4 is a cross sectional diagram showing a method of manufacturing a field-effect transistor according to the second embodiment of the present invention shown in FIG. 3.

A manufacturing method of this embodiment will be described. It is basically the same as that described in the first embodiment. Only different portions will be described. As shown in FIG. 4, when patterning (pattern-making process) is performed on the N+ type hetero semiconductor regions 4 by etching, the SiC drain region 2 is also etched during or following the patterning step, thus forming etched SiC surfaces 19 corresponding to the groove portions 10.

Moreover, as for the patterning of the N+ type hetero semiconductor regions 4, as described in the first embodiment, a region for forming the gate electrode 6 and regions for contact between the SiC drain region 2 and the P+type hetero semiconductor regions 3 may be formed by the same etching. When the patterning is performed, groove portions may be formed by etching in the SiC drain region 2 in the regions for contact between the SiC drain region 2 and the P+type hetero semiconductor regions 3, and the region for forming the gate electrode 6, during or following the patterning step. In this case, a groove portion is also formed at a position where the gate electrode 6 is to be formed. This enables a groove to be formed in a gate portion in the same step. Accordingly, an effect is produced, which is that a deep gate portion can be formed without increasing the number of steps.

Steps other than the above-described ones are the same as those of the first embodiment.

Next, the operation of the field-effect transistor manufactured by the manufacturing method of this embodiment will be described with effects thereof. Basic effects are similar to those described in the first embodiment. In this embodiment, the P+type hetero semiconductor regions 3 can be formed at positions deeper than the heterointerfaces of current paths, along the groove portions 10 formed in the semiconductor base. This produces a unique effect that a depletion layer extending from the heterojunction into the N− type SiC drain region 2 comes to easily spread even immediately under the gate electrode 6 in the case where a voltage is applied to the drain electrode 9 with respect to the source electrode 8 when the element is off, and that OFF characteristics of the element are thereby further improved.

Third Embodiment

Figure 5:
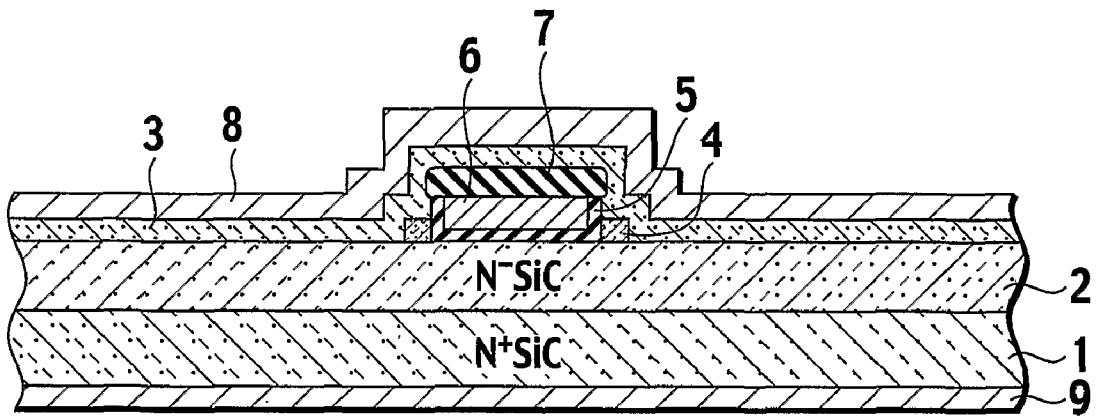
FIG. 5 shows a cross-sectional device structure of a field-effect transistor, which is a third embodiment of the present invention, taken along V-V' line of FIG. 7.
Figure 6:
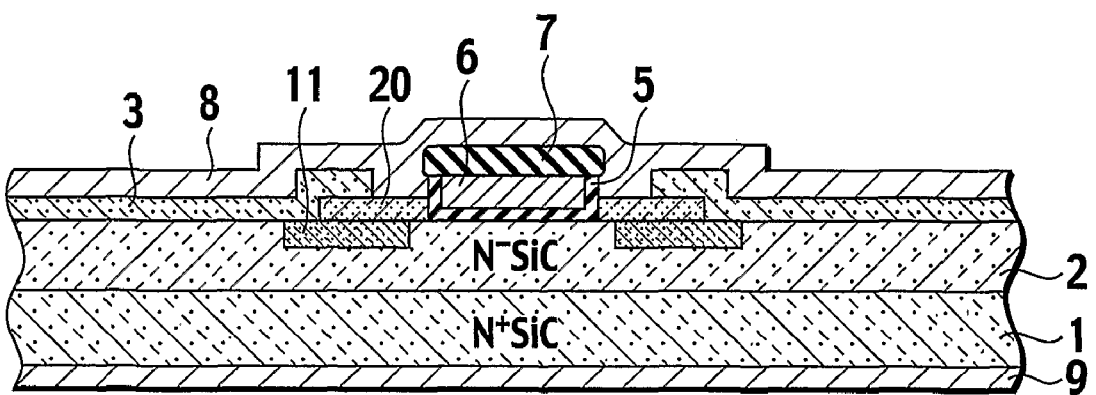
FIG. 6 shows a cross-sectional device structure of a field-effect transistor, which is a third embodiment of the present invention, taken along VI-VI' line of FIG. 7.

FIGS. 5 and 6 show cross-sectional device structures of a field-effect transistor, which is a third embodiment of the present invention. Cross sections in this case are cross sections in planes, which are parallel to current flowing between the source electrode 8 and the drain electrode 9, and which intersect the gate electrode 6. The cross sections shown in FIGS. 3 and 4 are parallel to each other. In addition, FIG. 10 shows a plan layout view showing the positions where the cross-sectional structures respectively shown in FIGS. 5 and 6 appear.

The structures shown in FIGS. 5 and 6 correspond to cross-sectional structures in which two unit cells are placed opposite each other as in the structure shown in FIG. 1. In these drawings, the basic structures are the same as that described using FIG. 1. Accordingly, only different portions will be described.

Figure 7:
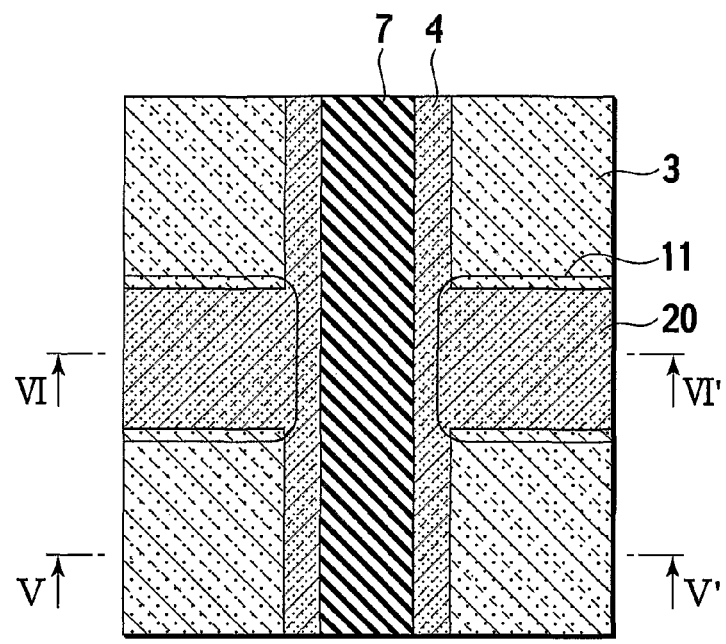
FIG. 7 shows a plan layout of a field-effect transistor, which is a third embodiment of the present invention.

First, FIG. 5 corresponds to a cross section taken along V-V' line of the plan layout shown in FIG. 7. The N+ type hetero semiconductor regions 4 are formed to be very narrow regions, and are in contact with the N− type SiC drain region 2 in small areas. In FIG. 5, these areas are represented as the contact lengths between the N− type SiC drain region 2 and the N+ type hetero semiconductor regions 4. The P+type hetero semiconductor region 3 is formed over the entire surface so as to cover the above-described structure. In this cross section, the N+ type hetero semiconductor regions 4 are not in direct contact with the source electrode 8.

Next, FIG. 6 corresponds to a cross section taken along VI-VI' line of the plan layout shown in FIG. 7, and is a cross-sectional structure in the depth direction of the drawing with respect to the cross section of FIG. 5. In this cross section, portions of the P+type hetero semiconductor regions 3 are etched, and N+ type hetero semiconductor regions 20 are widely formed in order to obtain sufficient contact areas (denoted by 20 in FIG. 7) with the source electrode 8. In FIG. 6, the contact areas between the SiC drain region 2 and the N+ type hetero semiconductor regions 20 are represented as the contact lengths between the SiC drain region 2 and the N+ type hetero semiconductor regions 20 in FIG. 5. These lengths are longer than the contact lengths between the SiC drain region 2 and the N+ type hetero semiconductor regions 4. In addition, P type well regions 11 are formed in regions of the surface of the SiC drain region 2 which are in contact with the N+ type hetero semiconductor regions 4. The well regions 11 are not formed in the vicinity of the interface with the gate insulating film 5 which serves as current paths.

A manufacturing method of this embodiment is basically the same as that described in the first embodiment. However, before the N+ type hetero semiconductor regions 4 are formed, the P type well regions 11 are selectively formed from the surface of the N− type SiC drain region 2 using means such as ion implantation.

According to this embodiment, it becomes possible to sufficiently narrowly form the N+ type hetero semiconductor regions 4, which are the hetero semiconductor regions of the first conductivity type, and an effect is obtained, which is that OFF characteristics of the element are further improved.

Fourth Embodiment

Figure 8:
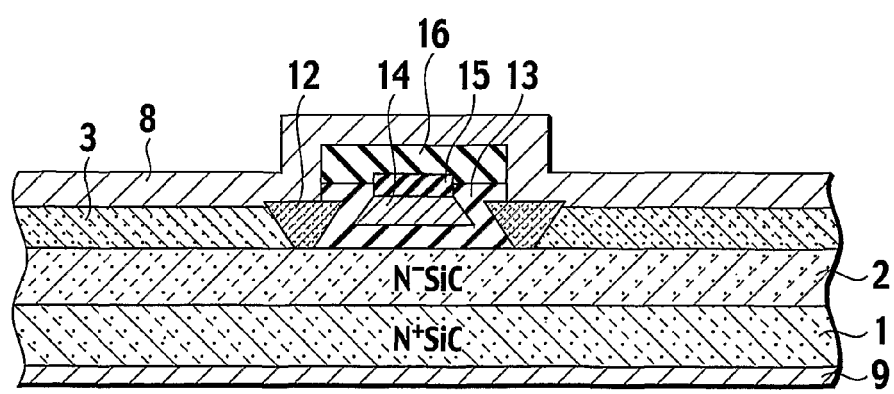
FIG. 8 shows a cross-sectional device structure of a field-effect transistor, which is a fourth embodiment of the present invention.

FIG. 8 shows a cross-sectional device structure of a field-effect transistor, which is a fourth embodiment of the present invention. A cross section in this case is a cross section taken along a plane, which is parallel to current flowing between the source electrode 8 and the drain electrode 9, and which intersects the gate electrode 14. This cross-sectional structure corresponds to a cross-sectional structure in which two unit cells are placed opposite each other as in the cross-sectional structure shown in FIG. 1. The basic structure is the same as that described using FIG. 1. Accordingly, only different portions will be described.

In FIG. 8, the cross-sectional shapes of N+ type hetero semiconductor regions 12 are each an inverted trapezoid having an upper base longer than a lower base thereof. The upper base is in contact with the source electrode 8, and the lower base is in contact with the N− type SiC drain region 2. That is, the N+ type hetero semiconductor regions 12 each have a shape, in which the bottom portion in contact with the N− type SiC drain region 2 is narrow, and in which the upper surface portion in contact with the source electrode 8 is wide. Etched side surfaces of the N+ type hetero semiconductor regions 12 each have reverse tapered shape. A gate insulating film 13 is formed along these etched surfaces.

A manufacturing process of this embodiment will be described using FIGS. 9A to 9H.

Figure 9A:
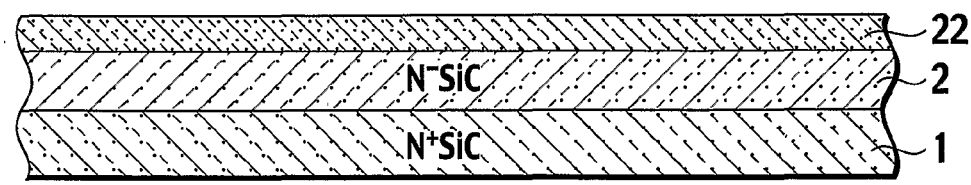
FIG. 9A to 9H are cross sectional diagrams showing a method of manufacturing a field-effect transistor according to the fourth embodiment of the present invention shown in FIG. 8.

In FIG. 9A, a lightly doped N type (N− type) SiC drain region 2 is formed, which is epitaxially grown on one main surface of a heavily doped N type (N+ type) SiC substrate region 1. Furthermore, after the surface of the drain region 2 is cleaned by pretreatment or the like, a Poly-Si layer 22 is deposited. A typical thickness of the poly-Si layer 22 is in the range of several hundreds of angstroms to several micrometers. After the deposition of the poly-Si layer 22, high-temperature heat treatment may be performed at a temperature of not more than 1300° C. in order to control the sizes of grain boundaries of poly-Si and reduce the resistances of the current paths when the element is on. Thereafter, an impurity of N+ type is introduced into the poly-Si layer 22. As a method of introducing the N+ type impurity, ion implantation may be used, or a method such as deposition/diffusion or vapor-phase diffusion may be used.

Figure 9B:
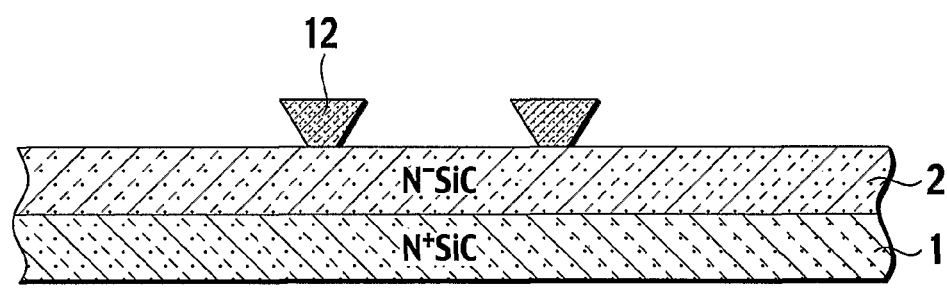

In FIG. 9B, the N+ type hetero semiconductor regions 12, which are opposed to each other at a short distance across a region for forming the gate electrode 7, is formed at desired positions on the main surface side by etching the poly-Si layer 22, whereby the surface of the lightly doped N type (N− type) SiC drain region 2 is exposed. At this time, by controlling etching conditions, etching is performed so that the etched surfaces of the N+ type hetero semiconductor regions 12 have reverse tapered shapes. By such a step, the cross-sectional shapes of the N+ type hetero semiconductor regions 12 become inverted trapezoids having upper bases longer than lower bases thereof. Here, the surface of the lightly doped N type (N− type) SiC drain region 2 is not etched, but may be etched to be grooved, for example, as shown in FIG. 4. In that case, the region for forming the gate electrode 7 is also etched to be grooved.

Figure 9C:
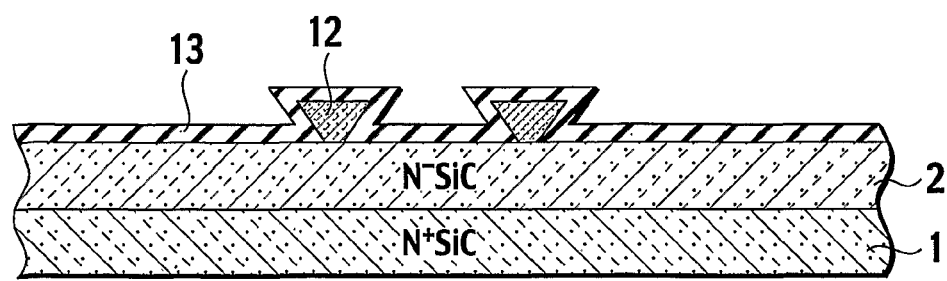

In FIG. 9C, a deposited film which becomes the gate insulating film 13 is deposited (denoted by the same reference numeral 13) on the main surface side. A typical thickness of the deposited film 13 is in the range of several hundreds of angstroms to several thousands of angstroms. Then, high-temperature nitriding is performed in an NO or $N_2O$ atmosphere at a temperature of, for example, 900° C. to 1300° C. for approximately several tens of minutes in order to reduce interface states at the interface between the gate insulating film 13 and the lightly doped N type (N− type) SiC drain region 2 or between the gate insulating film 13 and the N+ type hetero semiconductor regions 12.

Figure 9D:
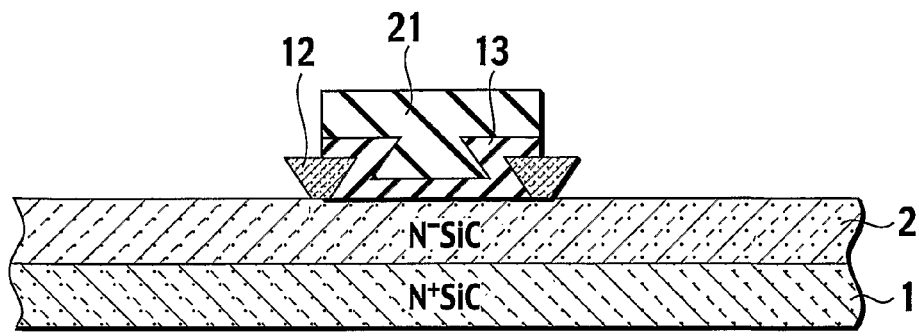

In FIG. 9D, an insulating film other than an effective gate insulating film 13 is etched using a resist mask 21. After the resist mask 21 is removed, poly-Si is first thickly deposited, and an impurity is introduced so that the poly-Si becomes P+type.

Figure 9E:
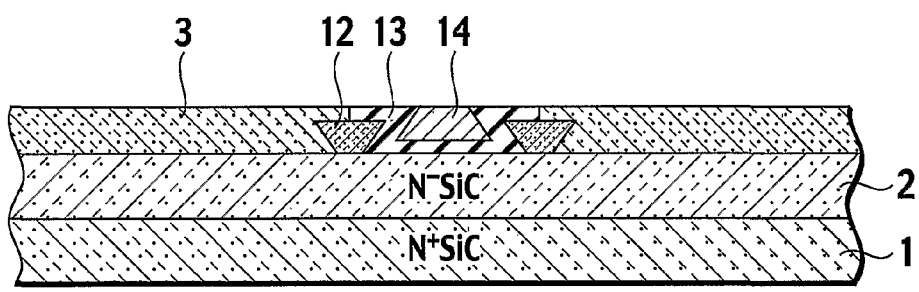

As shown in FIG. 9E, the poly-Si thickly deposited as described above is etched back to a state in which it fills up an etched portion that becomes the gate electrode 14 and regions that become the P+type hetero semiconductor regions 3.

Figure 9F:
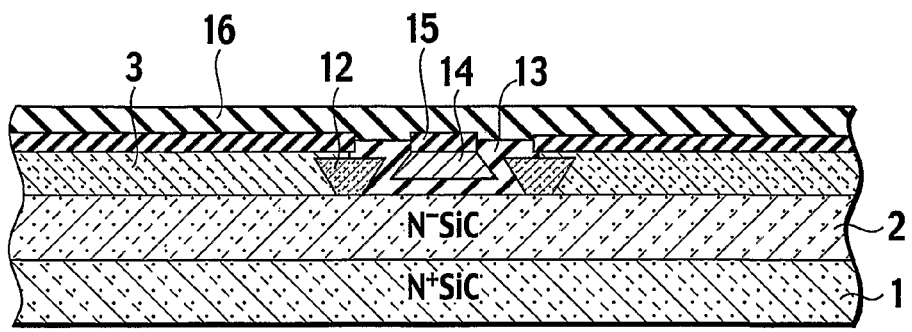

In FIG. 9F, oxidation is performed on the gate electrode 14 and the P+type hetero semiconductor regions 3 simultaneously, whereby a cap oxide film 15 is formed. Furthermore, an interlayer insulating film 16 is deposited.

Figure 9G:
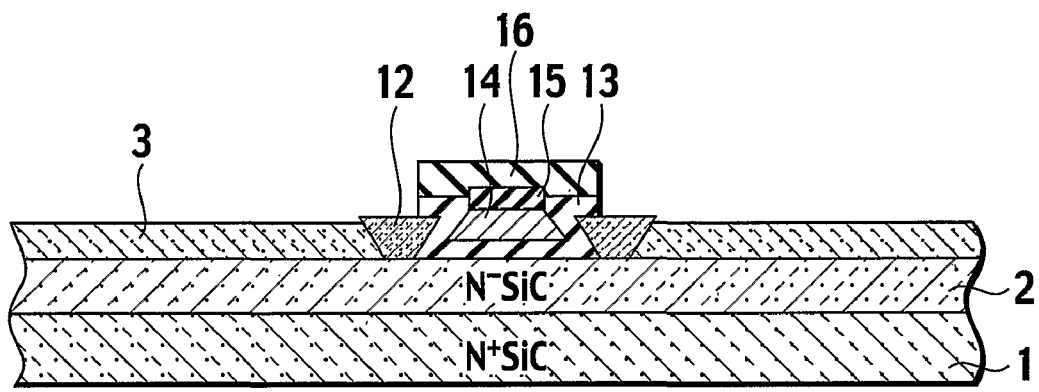

In FIG. 9G the surrounding unnecessary insulating film is etched using a pattern of a resist mask so that the cap oxide film 15 and the interlayer insulating film 16 on the gate electrode 14 are left.

Figure 9H:
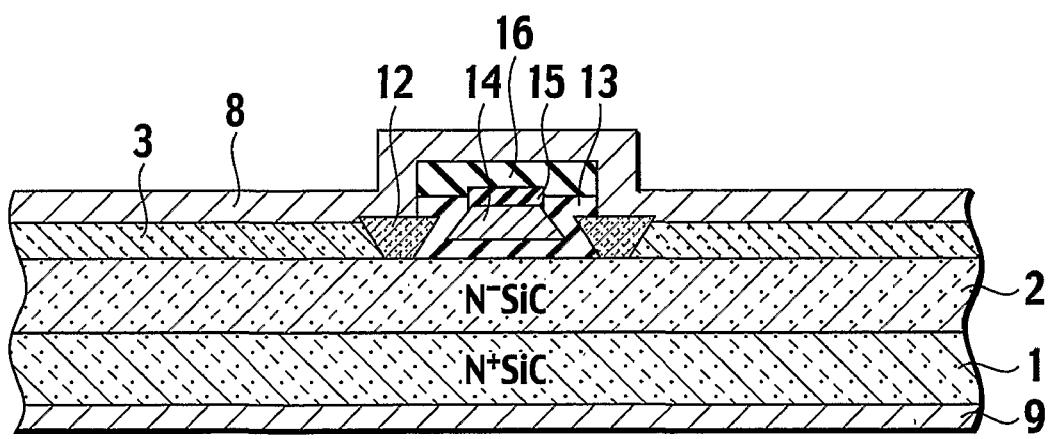

In FIG. 9H, the source electrode 8 having metal or the like as a constituent material is formed over the entire region on a first main surface side to make low-resistance electrical connections to the P+type hetero semiconductor regions 3 and the N+ type hetero semiconductor regions 4. Furthermore, the drain electrode 9 having metal or the like as a constituent material is formed on the entire back surface side of the substrate region 1 to form a low-resistance ohmic contact thereto. By the above-described process, a device of this embodiment is completed.

In this embodiment, since the bottom portions of the N+ type hetero semiconductor regions 12 are narrow, sufficient OFF characteristics of the element are obtained; at the same time, since the N+ type hetero semiconductor regions 12 and the source electrode 8 can be in contact with each other in wide areas, source contact resistance can be sufficiently reduced. Moreover, there is a unique effect that mask alignment can be performed using wide regions corresponding to the upper surfaces of the N+ type hetero semiconductor regions 12, which are the hetero semiconductor regions of the first conductivity type, while the bottom portions can be formed in a self-aligned manner.

In addition, the N+ type hetero semiconductor regions 12 are etched to have reverse tapered shapes on both sides thereof in this embodiment, but may have shapes which are vertically etched respectively on the sides where the gate electrodes are respectively formed in terms of structure or on opposed sides. Moreover, in this embodiment, the deposition of poly-Si for forming the gate electrode 14 and the deposition of poly-Si for forming the P+type hetero semiconductor regions 3 can be performed simultaneously. Accordingly, there is a peculiar effect that the total process can be shortened.

It should be noted that though the semiconductor base is made of silicon carbide (SiC), and the hetero semiconductor regions are made of polysilicon (poly-Si) in the above-described embodiment, the effects of the present invention are also produced even if the semiconductor base is made of any one of gallium nitride (GaN), and diamond and the hetero semiconductor regions are made of any one of single-crystal silicon, amorphous silicon, germanium (Ge), and gallium arsenide (GaAs).

It should be noted that though N type is the first conductivity type and P type is the second conductivity type in the aforementioned embodiment, the effects of the present invention are also produced even if the conductivity types are reversed, respectively.

The entire content of a Patent Application No. TOKUGAN 2005-260696 with a filing date of Sep. 8, 2005 in Japan is hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

INDUSTRIAL APPLICABILITY

The present invention is applicable to a process of manufacturing a semiconductor device having low on-resistance and greatly improved reverse characteristics.

The invention claimed is:

1. A semiconductor device comprising:
a semiconductor base of a first conductivity type;
a hetero semiconductor region in contact with the semiconductor base, the hetero semiconductor region having a band gap different from that of the semiconductor base;
a gate electrode adjacent to a portion of a junction between the hetero semiconductor region and the semiconductor base across a gate insulating film;
a source electrode connected to the hetero semiconductor region; and
a drain electrode connected to the semiconductor base,
wherein the hetero semiconductor region includes a first and a second hetero semiconductor regions, the first hetero semiconductor region is formed before the gate insulating film is formed, and the second hetero semiconductor region is formed after the gate insulating film is formed.

2. The semiconductor device according to claim 1, wherein the second hetero semiconductor region is formed after the gate insulating film is subjected to heat treatment.

3. The semiconductor device according to claim 1, wherein the first hetero semiconductor region is subjected to heat treatment before the second hetero semiconductor region is formed.

4. The semiconductor device according to claim 1, wherein the first and second hetero semiconductor regions have portions overlapping each other in a direction from the source electrode to the drain electrode, and the first hetero semiconductor region is in direct contact with the source electrode.

5. The semiconductor device according to claim 4, wherein a groove portion reaching a position closer to the drain electrode than a position where the first hetero semiconductor region is in contact with the semiconductor base is formed in the semiconductor base, and the second hetero semiconductor region is in contact with the semiconductor base in the groove portion.

6. The semiconductor device according to claim 1, wherein a contact length between the first hetero semiconductor region and the semiconductor base in a first cross section taken along a plane, which is parallel to current flowing between the source electrode and the drain electrode, and which intersects the gate electrode differs from a contact length between the first hetero semiconductor region and the semiconductor base in a second cross section, which is parallel to the first cross section, and which exists at a position different from that of the first cross section, and the first hetero semiconductor region is in contact with the source electrode in the second cross section.

7. The semiconductor device according to claim 6, wherein the contact length between the first hetero semiconductor region and the semiconductor base in the second cross section is larger than the contact length between the first hetero semiconductor region and the semiconductor base in the first cross section.

8. The semiconductor device according to claim 1, wherein a cross-sectional shape of the first hetero semiconductor region in a cross section taken along a plane, which is parallel to current flowing between the source electrode and the drain electrode, and which intersects the gate electrode is an inverted trapezoid having an upper base longer than a lower base thereof, the upper base is in contact with the source electrode, and the lower base is in contact with the semiconductor base.

9. The semiconductor device according to claim 1, wherein,
the semiconductor base is made of any one of silicon carbide, gallium nitride, and diamond, and
the hetero semiconductor region is made of any one of single-crystal silicon, polysilicon, amorphous silicon, germanium, and gallium arsenide.

10. The semiconductor device according to claim 2, wherein the first hetero semiconductor region is subjected to heat treatment before the second hetero semiconductor region is formed.

11. The semiconductor device according to claim 2, wherein the first and second hetero semiconductor regions have portions overlapping each other in a direction from the source electrode to the drain electrode, and the first hetero semiconductor region is in direct contact with the source electrode.

12. A method of manufacturing a semiconductor device including a semiconductor base of a first conductivity type, a hetero semiconductor region in contact with the semiconductor base, the hetero semiconductor region having a band gap different from that of the semiconductor base, a gate electrode adjacent to a portion of a junction between the hetero semiconductor region and the semiconductor base across a gate insulating film, a source electrode connected to the hetero semiconductor region, and a drain electrode connected to the semiconductor base, the method comprising:
configuring the hetero semiconductor region of a first and a second hetero semiconductor regions;
forming the first hetero semiconductor region before the gate insulating film is formed; and
forming the second hetero semiconductor region after the gate insulating film is formed.

13. The method of manufacturing the semiconductor device according to claim 12, wherein the second hetero semiconductor region is formed after the gate insulating film is subjected to heat treatment.

14. The method of manufacturing the semiconductor device according to claim 12, wherein the first hetero semiconductor region is subjected to heat treatment before the second hetero semiconductor region is formed.

15. The method of manufacturing the semiconductor device according to claim 12, wherein the second hetero semiconductor region is formed so that the first and the second hetero semiconductor regions have portions overlapping each other in a direction from the source electrode to the drain electrode, and the source electrode is formed so that the first hetero semiconductor region has a portion in direct contact with the source electrode.

16. The method of manufacturing the semiconductor device according to claim 12, wherein when the first hetero semiconductor region is patterned, a region for forming the gate electrode and a region for contact between the second hetero semiconductor region and the semiconductor base are formed by the same etching step.

17. The method of manufacturing the semiconductor device according to claim 15, wherein a groove portion reaching a position closer to the drain electrode than a position, where the first hetero semiconductor region is in contact with the semiconductor base, is formed in the semiconductor base, and the second hetero semiconductor region is formed in the groove portion to be in contact with the semiconductor base.

18. The method of manufacturing the semiconductor device according to claim 16, wherein during or following the step of patterning the first hetero semiconductor region, in the region for contact between the second hetero semiconductor region and the semiconductor base and the region for forming the gate electrode, a groove portion reaching a position closer to the drain electrode than a position where the first hetero semiconductor region is in contact with the semiconductor base is formed in the semiconductor base by etching.

19. The method of manufacturing the semiconductor device according to claim 12, wherein the first hetero semiconductor region is formed so that a cross-sectional shape of the first hetero semiconductor region in a cross section taken along a plane which is parallel to current flowing between the source electrode and the drain electrode and which intersects the gate electrode is an inverted trapezoid having an upper base longer than a lower base thereof, and so that the lower base is in contact with the semiconductor base, and the source electrode is formed to be in contact with the upper base.

20. The method of manufacturing the semiconductor device according to claim 12, wherein the semiconductor base is made of any one of silicon carbide, gallium nitride, and diamond; and the hetero semiconductor region is made of any one of single-crystal silicon, polysilicon, amorphous silicon, germanium, and gallium arsenide.

* * * * *